United States Patent [19]

Clark et al.

[11] Patent Number: 5,077,594
[45] Date of Patent: Dec. 31, 1991

[54] INTEGRATED HIGH VOLTAGE TRANSISTORS HAVING MINIMUM TRANSISTOR TO TRANSISTOR CROSSTALK

[75] Inventors: Lowell E. Clark, Phoenix; Robert B. Davies, Tempe; Bernard W. Boland, Scottsdale, all of Ariz.

[73] Assignee: Motorola, Inc., Schaumburg, Ill.

[21] Appl. No.: 494,652

[22] Filed: Mar. 16, 1990

[51] Int. Cl.⁵ .................. H01L 29/72; H01L 29/06
[52] U.S. Cl. ............................... 357/35; 357/34; 357/20; 357/88
[58] Field of Search ............ 357/35, 34, 20, 88

[56] References Cited

U.S. PATENT DOCUMENTS

| 4,089,021 | 5/1978 | Sato et al. | 357/34 |
| 4,130,826 | 12/1978 | Bachle et al. | 357/34 |
| 4,160,988 | 7/1979 | Russell | 357/35 |
| 4,255,209 | 3/1981 | Morcom et al. | 357/35 |
| 4,929,996 | 5/1990 | Hutter | 357/34 |

FOREIGN PATENT DOCUMENTS

| 60-233856 | 11/1985 | Japan | 357/35 |
| 1-123472 | 5/1989 | Japan | 357/34 |
| 1-196172 | 8/1989 | Japan | 357/34 |

OTHER PUBLICATIONS

Berger, "Method of Producing a Lateral Transistor", IBM Technical Disclosure Bulletin, vol. 23, No. 3, Aug. 1980.
Anantha et al, "High-Voltage Power Transistors", IBM Technical Disclosure Bulletin, vol. 16, No. 9, Feb. 1974.

Primary Examiner—Andrew J. James
Assistant Examiner—Ngan Van Ngo
Attorney, Agent, or Firm—Miriam Jackson; Joe E. Barbee

[57] ABSTRACT

Integrated high voltage transistors having minimum transistor to transistor crosstalk are fabricated in refilled epitaxial tubs, which are formed in a heavily doped substrate. The heavily doped substrate provides the isolation between each transistor, and thus provides for minimum transistor to transistor crosstalk. The voltage capability of the transistor is increased by forming the base surrounding the collector contact in the refilled epitaxial tub.

12 Claims, 2 Drawing Sheets

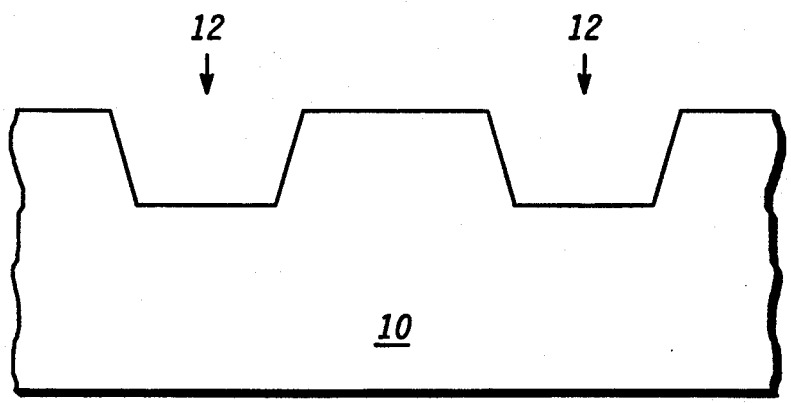
FIG. 1
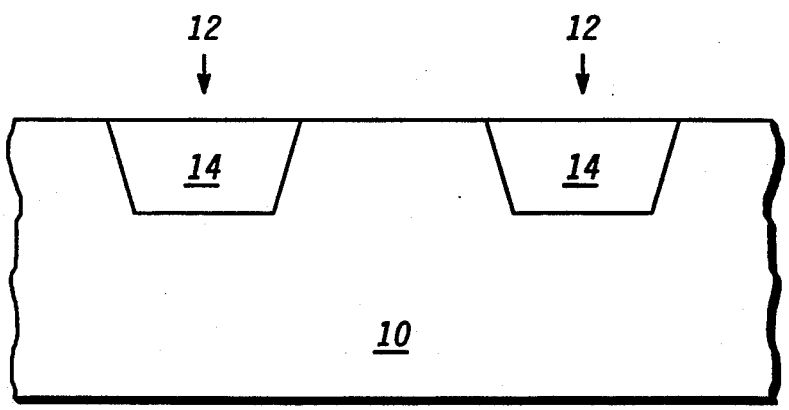
FIG. 2
FIG. 3
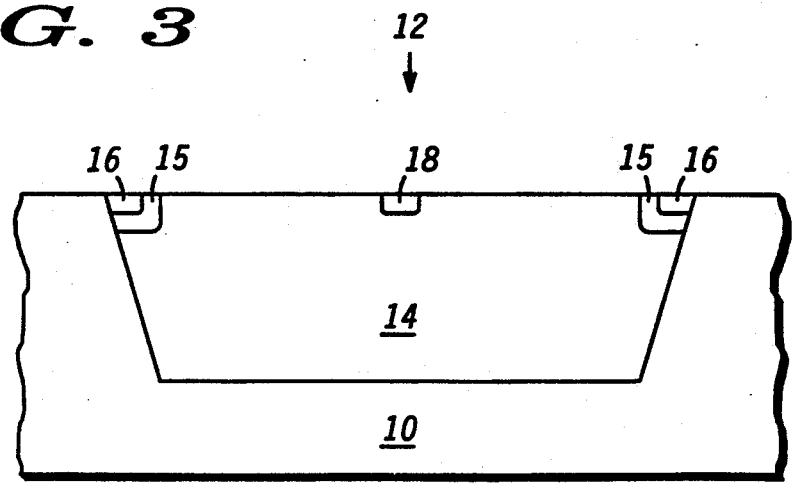

INTEGRATED HIGH VOLTAGE TRANSISTORS HAVING MINIMUM TRANSISTOR TO TRANSISTOR CROSSTALK

BACKGROUND OF THE INVENTION

This invention relates, in general, to semiconductor devices, and more particularly, to improved integrated high voltage transistors having minimum transistor to transistor crosstalk.

When transistors are used in AC or multiphase DC applications, it is desirable to have multiple integrated high voltage current sources with gate control. When these high voltage devices are integrated on a single substrate, crossstalk between the transistors is a problem.

Conventional P-N junction isolation is used to prevent interaction between multiple devices formed on the same substrate. P-N junction isolation is formed by diffusing dopants of the same conductivity type as the substrate and opposite the epitaxial layer from the surface of the epitaxial layer down to the substrate. Several isolation regions are formed to create isolated epitaxial regions, where active devices are formed. When using P-N junction isolation, a thin, lightly doped epitaxial layer must be used so that only a short isolation diffusion time is required. A short isolation diffusion time reduces the amount of dopants outdiffusing from the substrate into the epitaxial layer. The use of a lightly doped substrate also reduces the amount of substrate outdiffusion. The outdiffusion of the substrate dopants into the epitaxial layer may detrimentally affect the voltage capability of the device. Increasing the thickness of the epitaxial layer does not increase the voltage capability of the device because this requires longer isolation diffusion times, resulting in greater substrate outdiffusion.

Another disadvantage of using a lightly doped substrate is that not enough isolation is provided to prevent crosstalk from one transistor to another when several transistors are formed on a single substrate. A way of reducing the crosstalk between these integrated transistors is to provide a heavily doped substrate. A heavily doped substrate provides for higher recombination of carriers injected into the substrate, thus preventing the carriers from reaching the adjacent transistor and turning it on. However, as has been discussed above, the more heavily doped the substrate, the greater the outdiffusion of the substrate into the epitaxial layer when the isolation regions are diffused. Thus, a lightly doped substrate, which provides only approximately 10 dB (decibels) of isolation has been used in the prior art. Isolation as used here means the current ratio when one isolated region is forward biased with respect to the substrate and an adjacent isolated region is reverse biased with respect to the substrate. This amount of isolation is not enough to prevent crosstalk in multiphase circuits, for example. Consequently, each phase of a multiphase circuit of the prior art had to be made in a separate chip. It would be desirable to form multiple high voltage transistors on a single substrate.

A way of increasing the voltage capability of devices formed with conventional P-N junction isolation has been achieved by using REduced SURface Field (RE-SURF) technology. A RESURF structure is comprised of a lightly doped substrate and a thin epitaxial layer having a reduced doping level at the surface where the junctions are formed. Although a higher voltage device may be attainable using RESURF, a lightly doped substrate must also be used in this technology, which still results in devices having severe crosstalk. Moreover, the use of RESURF technology results in devices having fairly high saturation voltages.

Another method of obtaining isolation between active device regions is provided by the use of dielectric isolation. However, due to the high cost of forming dielectric isolation, it would be desirable to use a method which is simpler and of lower cost.

Accordingly, it is an object of the present invention to provide an improved method of fabricating integrated high voltage transistors having minimum transistor to transistor crosstalk.

Another object of the present invention is to provide integrated transistors having higher breakdown voltages than in the past.

A further object of the present invention is to provide integrated high voltage transistors having lower saturation voltages.

An additional object of the present invention is to provide a method of fabricating integrated high voltage transistors which is simple and of low cost.

Yet another object of the present invention is to provide integrated high voltage transistors having lower on-voltages.

SUMMARY OF THE INVENTION

In accordance with the present invention, the above and other objects and advantages are provided by fabricating high voltage transistors in refilled epitaxial tubs, which are formed in a heavily doped substrate. The heavily doped substrate provides the isolation between each transistor, and thus provides for minimum transistor to transistor crosstalk. The voltage capability of the transistor is increased by forming the base surrounding the collector contact in the refilled epitaxial tub.

In a further embodiment, the collector-base capacitance of the transistor is reduced by forming a buffer layer between the refilled epitaxial tub and the substrate.

BRIEF DESCRIPTION OF THE DRAWINGS

FIGS. 1 through 3 illustrate enlarged, cross-sectional views of a semiconductor device at different stages of fabrication, according to a first embodiment of the present invention;

DETAILED DESCRIPTION OF THE DRAWINGS

Figure 4:
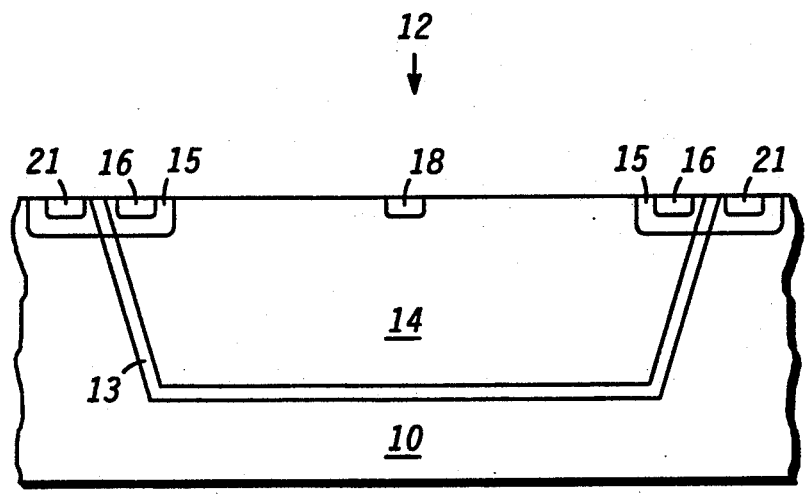
FIG. 4 illustrates an enlarged, cross-sectional view of a second embodiment of the present invention.

FIG. 1 illustrates a first embodiment of the present invention in a beginning stage of fabrication. What is shown is a heavily doped semiconductor substrate 10 of a first conductivity type. For example, if substrate 10 is N-type then it preferably has a resistivity of approximately 0.01 ohm-cm. Other suitable resistivities may be used, but for the purposes of this invention, substrate 10 should be heavily enough doped to provide at least approximately 50 dB of isolation. Typically, at least 60 dB of isolation has been achieved using structures made according to the present invention. Substrate 10 is shown having two openings 12 formed therein. A method of forming openings 12 is discussed with reference to FIG. 2.

FIG. 2 illustrates the structure of FIG. 1 further along in the fabrication process. Refilled epitaxial tubs 14 have been formed in openings 12. A preferred method of forming openings 12 and refilled epitaxial tubs 14 can be found in U.S. Pat. No. 4,609,413, which is issued to Boland et al. and is hereby incorporated by reference. Other suitable methods may also be used. Refilled epitaxial tubs 14 are of a second conductivity type, opposite that of substrate 10. In each refilled epitaxial tub 14, a separate transistor will be formed. Refilled epitaxial tub 14 serves as the collector of each transistor. Substrate 10 thus provides for the isolation of one refilled epitaxial tub 14 from another. The thickness and resistivity of refilled epitaxial tub 14 will depend on the desired breakdown voltage characteristics of the transistor. As an example, a high voltage transistor of approximately 600 volts and having a P-type conductivity refilled epitaxial layer 14 would have a refilled epitaxial layer 14 of a thickness of 50 to 70 microns and resistivity of 30 to 50 ohm-cm. Other suitable values may be used to achieve different electrical characteristics. As can be seen in FIG. 3, no isolation regions are diffused, thus substrate 10 may be heavily doped and refilled epitaxial tub 14 may be as thick as is desirable. Heavily doped substrate 10 will provide for minimum transistor to transistor crosstalk. A plurality of refilled epitaxial tubs 14 may be formed in substrate 10, but for illustrative convenience only two refilled epitaxial tubs 14 have been shown. For further illustrative convenience, only one refilled epitaxial tub 14 will be shown in the remaining FIGS.

FIG. 3 illustrates a portion of the structure of FIG. 2 further along in the fabrication process. A transistor is formed in refilled epitaxial tub 14. The transistor is comprised of a base region 15, an emitter region 16, and a collector contact region 18. Base region 15 is of the first conductivity type, emitter region 16 is of the second conductivity type, and collector contact region 18 is of the second conductivity type. The formation of each region 15, 16, and 18 is well known in the art, as well as the appropriate doping levels of each, and thus will not be discussed in detail here. Collector contact region 18 is formed in the center of the refilled epitaxial tub 14. Base region 15 is formed so that it is surrounding collector contact region 18 and abutting substrate 10. Emitter region 16 is formed in base region 15. This configuration, in conjuction with a thick refilled epitaxial layer 14 enables the voltage capability of the transistor to be enhanced. Thus integrated high voltage transistors are formed having minimum transistor to transistor crosstalk. RESURF technology is not needed to fabricate these high voltage transistors, thus, they do not have high saturation voltages. In addition, the transistors of the present invention have improved on-voltages. The method used to fabricate the transistors is simple, requiring less processing steps than other methods used in the past, and is therefore of low cost. Another advantage of the present invention is that electrical connections may be made to collector contact 18 without having metal cross heavily doped substrate 10. This provides for increased reliability.

FIG. 4 illustrates an enlarged, cross-sectional view of a second embodiment of the present invention. The structure of FIG. 4 is similar to that of FIG. 3, however, a buffer layer 13 is formed in opening 12 before refilled epitaxial tub 14 is formed. Buffer layer 13 is thus formed between substrate 10 and refilled epitaxial tub 14 and makes contact with base region 15. Buffer layer 13 is of the same conductivity type as substrate 10, however, buffer layer 13 is preferably not as heavily doped. A preferable thickness of refilled epitaxial layer 13 is approximately 5 to 30 microns. Buffer layer 13 reduces the collector-base capacitance of the transistor. Base region 15 is shown to extend into substrate 10, and a base contact region 21 is formed therein to provide enhanced ohmic contact. By forming base contact region 21 outside of refilled epitaxial tub 14, the amount of area each transistor uses may be reduced by utilizing substrate 10 between refilled epitaxial tubs 14. If base contact region 21 is formed inside refilled epitaxial tub 14, refilled epitaxial tub 14 would have to be made larger or accommodate the electrical contact (not shown) to base contact region 21. In this embodiment, base region 15 is electrically connected to substrate 10, which may be desirable in certain applications.

Figure 5:
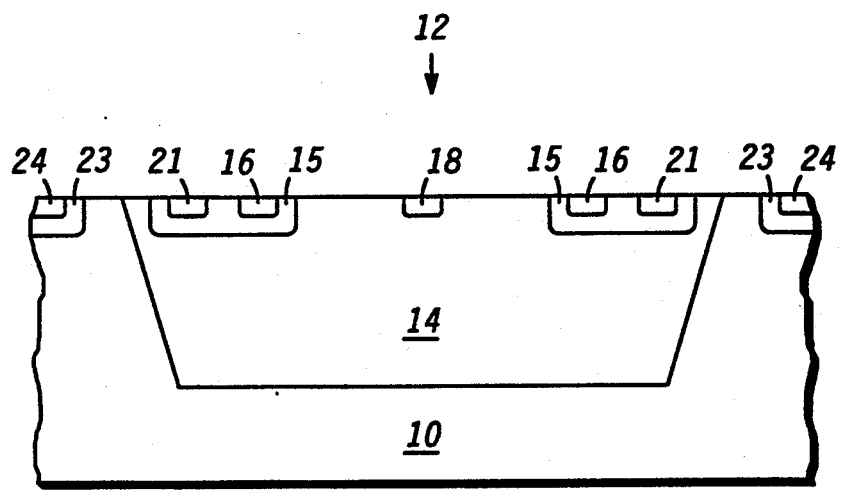
FIG. 5 illustrates an enlarged, cross-sectional view of a further embodiment of the present invention.

FIG. 5 illustrates an enlarged, cross-sectional view of a further embodiment of the present invention. In this embodiment, base region 15 is not electrically connected to substrate 10. Base region 15 and base contact region 21 are formed totally within epitaxial tub 14. Regions 23 and 24 are the same diffusions as base region 15 and base contact region 21, but no longer act as base regions, thus are referenced with different numerals. In this embodiment, emitter region 16 may be electrically connected through metallization (not shown) to substrate 10 through region 24. This may be desirable in certain applications.

The completion of the transistor illustrated in FIGS. 3 through 5 is well known in the art and thus will not be illustrated further.

By now it should be appreciated that there has been provided a new and improved method of fabricating integrated high voltage transistors having minimum transistor to transistor crosstalk.

We claim:

1. A semiconductor device, comprising:
   a heavily doped semiconductor substrate of a first conductivity type having a top surface and a plurality of openings formed therein extending from the top surface to a predetermined depth in the substrate;
   a plurality of refilled epitaxial tubs of a second conductivity type formed in the openings of the heavily doped substrate, the refilled epitaxial tubs being completely surrounded by the heavily doped substrate;
   a collector contact region of the second conductivity type formed in each refilled epitaxial tub;
   a base region of the first conductivity type formed in each refilled epitaxial tub completedly surrounding the collector contact region; and
   an emitter region of the second conductivity type formed in the base region.

2. The semiconductor device of claim 1 wherein the heavily doped substrate provides for at least 50 decibels of isolation between each refilled epitaxial tub.

3. The semiconductor device of claim 1 wherein the base region is abutting the heavily doped substrate.

4. The semiconductive device of claim 1 further comprising a buffer layer of the first conductivity type formed between the substrate and each refilled epitaxial tub, and wherein the buffer layer makes contact with the base region.

5. The semiconductor device of claim 4 wherein the thickness of the buffer layer is approximately 5 to 30 microns.

6. The semiconductor device of claim 1 further comprising the emitter region to be electrically connected to the heavily doped semiconductor substrate.

7. A semiconductor device, comprising:
a heavily doped semiconductor substrate of a first conductivity type having a top surface and a plurality of openings formed therein extending from the top surface to a predetermined depth in the substrate;
a plurality of refilled epitaxial tubs formed in the openings of the substrate, each refilled epitaxial tub having a thin portion of a first conductivity type adjacent the substrate and a remaining portion of a second conductivity type, and wherein the heavily doped substrate completely surrounds each refilled epitaxial tub;
a collector contact region of the second conductivity type formed in each refilled epitaxial tub;
a base region of the first conductivity type formed partially in each refilled epitaxial tub and partially in the substrate surrounding the collector contact region;
an emitter region of the second conductivity type formed in the base region; and
a base contact region formed in the base region outside of each refilled epitaxial tub.

8. The semiconductor device of claim 7 wherein the heavily doped substrate provides for al least 50 decibels of isolation between each refilled epitaxial tub.

9. The semiconductor device of claim 7 further comprising a buffer layer of the first conductivity type formed between the substrate and each refilled epitaxial tub, and wherein the buffer layer makes contact with the base region.

10. The semiconductor device of claim 7 wherein the thickness of the buffer layer is approximately 5 to 30 microns.

11. The semiconductor device of claim 7 further comprising the emitter region to be electrically connected to the heavily doped semiconductor substrate.

12. A semiconductor device, comprising:
a heavily doped semiconductor substrate of a first conductivity type having a top surface and a plurality of openings formed therein extending from the top surface to a predetermined depth in the substrate;
a plurality of refilled epitaxial tubs of a second conductivity type formed in the openings of the heavily doped substrate, the refilled epitaxial tubs being completely surrounded by the heavily doped substrate and in physical contact with the heavily doped substrate on all sides except the top surface of the heavily doped substrate;
a collector contact region of the second conductivity type formed in each refilled epitaxial tub;
a base region of the first conductivity type formed in each refilled epitaxial tub surrounding the collector contact region; and
an emitter region of the second conductivity type formed in the base region.

* * * * *